US010240803B2

(12) United States Patent
Marchetti

(10) Patent No.: US 10,240,803 B2
(45) Date of Patent: Mar. 26, 2019

(54) AIRFOIL FRAME FOR COMPUTER ROOM AIR CONDITIONING UNIT

(71) Applicant: SCHNEIDER ELECTRIC IT CORPORATION, West Kingston, RI (US)

(72) Inventor: Daniele Marchetti, Chioggia (IT)

(73) Assignee: SCHNEIDER ELECTRIC IT CORPORATION, West Kingston, RI (US)

( * ) Notice: Subject to any disclaimer, the term of this patent is extended or adjusted under 35 U.S.C. 154(b) by 0 days.

(21) Appl. No.: 15/955,751

(22) Filed: Apr. 18, 2018

(65) Prior Publication Data

US 2018/0231261 A1    Aug. 16, 2018

Related U.S. Application Data

(62) Division of application No. 14/699,759, filed on Apr. 29, 2015, now Pat. No. 9,976,757.

(51) Int. Cl.
| | |
|---|---|
| *F24F 1/00* | (2011.01) |
| *F24F 13/08* | (2006.01) |
| *H05K 7/20* | (2006.01) |
| *F24F 1/0007* | (2019.01) |
| *F24F 1/0018* | (2019.01) |

(52) U.S. Cl.
CPC ............ *F24F 1/0007* (2013.01); *F24F 13/08* (2013.01); *F24F 13/081* (2013.01); *H05K 7/206* (2013.01); *F24F 1/0018* (2013.01)

(58) Field of Classification Search
CPC ........ F24F 1/0007; F24F 13/08; F24F 13/081; F24F 1/0081; F24F 1/0018; F04D 33/00; H05K 7/206
See application file for complete search history.

(56) References Cited

U.S. PATENT DOCUMENTS 3,888,090 A * 6/1975 Meyer ........................ B63J 2/04
62/217
5,810,659 A * 9/1998 Kim ........................ F24F 13/06
454/233

(Continued)

FOREIGN PATENT DOCUMENTS

CN    101371081 B    2/2011

OTHER PUBLICATIONS

Notification of Transmittal of the International Search Report and the Written Opinion of the International Searching Authority from Corresponding PCT/US2016/029684 dated Aug. 12, 2016.

(Continued)

*Primary Examiner* — Jon T. Schermerhorn, Jr.
(74) *Attorney, Agent, or Firm* — Lando & Anastasi, LLP

(57) ABSTRACT

A computer room air conditioner (CRAC) unit includes a housing having an inlet configured to receive IT air and an outlet configured to exhaust treated air. The CRAC unit further includes a heat exchanger supported by the housing and disposed between the inlet and the outlet of the housing and at least one fan module supported by the housing. The at least one fan module is configured to draw IT air into the housing through the inlet, direct IT air through the heat exchanger, and exhaust treated air through the outlet. The CRAC unit further includes an airfoil frame secured to the housing at the inlet of the housing.

4 Claims, 6 Drawing Sheets

(56) References Cited

U.S. PATENT DOCUMENTS

| | | | |
|---|---|---|---|
| 6,478,538 B2 * | 11/2002 | Kim | F04D 29/4226 |
| | | | 415/204 |
| 7,255,534 B2 * | 8/2007 | Liang | F01D 5/14 |
| | | | 415/115 |
| 8,434,723 B2 * | 5/2013 | Simpson | F15D 1/003 |
| | | | 244/130 |
| 2002/0039529 A1 | 4/2002 | Kim | |
| 2009/0211284 A1 | 8/2009 | Yabu et al. | |
| 2010/0317278 A1 * | 12/2010 | Novick | F24F 11/0001 |
| | | | 454/184 |
| 2011/0146965 A1 | 6/2011 | Gloeckner et al. | |
| 2012/0168145 A1 | 7/2012 | Peterson et al. | |
| 2014/0083661 A1 * | 3/2014 | Leckelt | F24F 11/0001 |
| | | | 165/163 |
| 2015/0159907 A1 * | 6/2015 | Kwon | F24F 13/08 |
| | | | 165/120 |
| 2016/0320076 A1 | 11/2016 | Marchetti | |

OTHER PUBLICATIONS

Extended European Search Report from corresponding European Application No. 16787111.0 dated Nov. 9, 2018.

* cited by examiner

AIRFOIL FRAME FOR COMPUTER ROOM AIR CONDITIONING UNIT

RELATED APPLICATIONS

This application is a divisional of pending U.S. patent application Ser. No. 14/699,759, filed Apr. 29, 2015, entitled AIRFOIL FRAME FOR COMPUTER ROOM AIR CONDITIONING UNIT, which is incorporated herein by reference in its entirety.

BACKGROUND OF THE DISCLOSURE

1. Field of Disclosure

The present disclosure relates generally to cooling systems used in a data center environment, and more particularly to an airfoil frame that is provided on a computer room air conditioning ("CRAC") unit.

2. Discussion of Related Art

Equipment enclosures or racks for housing electronic equipment, such as data processing, networking and telecommunications equipment have been used for many years. Such racks are used to contain and to arrange the equipment in large data centers, as well as small wiring closets and equipment rooms. In certain embodiments, an equipment rack can be an open configuration and can be housed within a rack enclosure, although the enclosure may be included when referring to a rack. A standard rack typically includes front mounting rails to which multiple units of electronic equipment, such as servers, CPUs and telecommunication equipment, are mounted and stacked vertically within the rack. With the proliferation of the Internet, it is not uncommon for a data center to contain hundreds of these racks. Further, with the ever decreasing size of computer equipment, and in particular, computer servers and blades, the number of electrical devices mounted in each rack has been increasing, raising concerns about adequately cooling the equipment.

Heat produced by rack-mounted equipment can have adverse effects on the performance, reliability and useful life of the equipment components. In particular, rack-mounted equipment, housed within an enclosure, may be vulnerable to heat build-up and hot spots produced within the confines of the enclosure during operation. The amount of heat generated by a rack of equipment is dependent on the amount of electrical power drawn by equipment in the rack during operation. In addition, users of electronic equipment may add, remove, and rearrange rack-mounted components as their needs change and new needs develop.

Previously, in certain configurations, data centers have been cooled by computer room air conditioner ("CRAC") units that are positioned around the periphery of the data center room. In one embodiment, a CRAC unit intakes air from the front of the unit and outputs cooler air upwardly toward the ceiling of the data center room. In other embodiments, the CRAC unit intakes air from near the ceiling of the data center room and discharges cooler air under a raised floor for delivery to the fronts of the equipment racks. In general, such CRAC units intake room temperature air (at about 72° F. (22° C.)) and discharge cold air (at about 55° F. (13° C.)), which is blown into the data center room and mixed with the room temperature air at or near the equipment racks. The rack-mounted equipment typically cools itself by drawing air along a front side or air inlet side of a rack, drawing the air through its components, and subsequently exhausting the air from a rear or vent side of the rack.

One exemplary CRAC unit is constituted by a box-shaped housing, which is opened at the top to receive a certain air flow rate and opened at the bottom to deliver the air flow to the servers. The housing typically supports a heat exchange coil to cool down the air entering the CRAC unit, and fans to move the air flow. Other devices that are needed to operate the CRAC unit, such as pipes used to connect the heat exchange coil, a pan to collect condensate, and other components, are supported within the housing.

One driver of the design of the CRAC unit is the amount of power used to operate the CRAC unit as compared to the cooling capacity of the CRAC unit. It is desirable to reduce the amount of power to operate the CRAC unit while increasing the cooling capacity. In order to reduce the absorbed power of the CRAC unit, efforts have been made in improving the fan efficiency, in optimizing the dimension of the CRAC unit housing, and evaluating components affecting the pressure drop within the CRAC unit. Within the CRAC unit, there are different causes for the pressure drops. FIG. 1 illustrates a thermal image of a typical CRAC unit in which the identified zones (indicated by circles) represent losses of energy. In particular, the identified zones are those in which embodiments of the airfoil frame as described herein are intended to reduce.

SUMMARY OF DISCLOSURE

One aspect of the present disclosure is directed to a computer room air conditioner unit comprising a housing having an inlet configured to receive IT air and an outlet configured to exhaust treated air, a heat exchanger supported by the housing and disposed between the inlet and the outlet of the housing, at least one fan module supported by the housing, the at least one fan module being configured to draw IT air into the housing through the inlet, direct IT air through the heat exchanger, and exhaust treated air through the outlet, and an airfoil frame secured to the housing at the inlet of the housing.

Embodiments of the computer room air conditioner unit configuring the airfoil frame with a front airfoil frame member secured to a front of the housing at the inlet of the housing. The airfoil frame may include a first side airfoil frame member secured to a side of the housing at the inlet of the housing. The airfoil frame may include a second side airfoil frame member secured to an opposite side of the housing at the inlet of the housing. The airfoil frame may include at least one airfoil frame member secured to the housing at the inlet of the housing. The at least one airfoil frame member may include a leading edge extending from the front of the housing. The at least one airfoil frame member further may include a trailing edge extending in a direction that is generally parallel to the front of the housing. The at least one airfoil frame member may be hollow in construction and further may include an outer surface extending from the leading edge to the trailing edge. The at least one airfoil frame member further may include a plurality of slots formed in the outer surface. Adjacent slots of the plurality of slots may be staggered with respect to one another.

Another embodiment of the present disclosure is directed to an airfoil frame for a computer room air conditioner unit. In one embodiment, the airfoil frame comprises at least one airfoil frame member secured to a housing of the computer room air conditioner unit at an inlet of the housing.

Embodiments of the airfoil frame may include configuring the at least one airfoil frame member includes a leading edge extending from a front of the housing of the computer room air conditioner unit. The at least one airfoil frame member further may include a trailing edge extending in a direction that is generally parallel to the front of the housing of the computer room air conditioner unit. The at least one airfoil frame member may be hollow in construction and further may include an outer surface extending from the leading edge to the trailing edge. The at least one airfoil frame member further may include a plurality of slots formed in the outer surface. Adjacent slots of the plurality of slots may be staggered with respect to one another.

Yet another embodiment of the present disclosure is directed to a method of reducing pressure drops within a computer room air conditioner unit comprising a housing having an inlet configured to receive IT air and an outlet configured to exhaust treated air, a heat exchanger supported by the housing and disposed between the inlet and the outlet of the housing, at least one fan module supported by the housing, the at least one fan module being configured to draw IT air into the housing through the inlet, direct IT air through the heat exchanger, and exhaust treated air through the outlet, and an airfoil frame secured to the housing at the inlet of the housing. In one embodiment, the method comprises: directing IT air over the airfoil frame of the housing of the computer room air conditioner unit.

Embodiments of the method further may include configuring the airfoil frame with at least one airfoil frame member secured to the housing at the inlet of the housing. The at least one airfoil frame member may include a leading edge extending from the front of the housing and a trailing edge extending in a direction that is generally parallel to the front of the housing. The at least one airfoil frame member may be hollow in construction and further includes an outer surface extending from the leading edge to the trailing edge. The at least one airfoil frame member further may include a plurality of slots formed in the outer surface.

BRIEF DESCRIPTION OF THE DRAWINGS

Various aspects of at least one embodiment are discussed below with reference to the accompanying figures, which are not intended to be drawn to scale. Where technical features in the figures, detailed description or any claim are followed by references signs, the reference signs have been included for the sole purpose of increasing the intelligibility of the figures, detailed description, and claims. Accordingly, neither the reference signs nor their absence are intended to have any limiting effect on the scope of any claim elements. In the figures, each identical or nearly identical component that is illustrated in various figures is represented by a like numeral. For purposes of clarity, not every component may be labeled in every figure. The figures are provided for the purposes of illustration and explanation and are not intended as a definition of the limits of the disclosure. In the figures:

DETAILED DESCRIPTION OF THE DISCLOSURE

Figure 1:
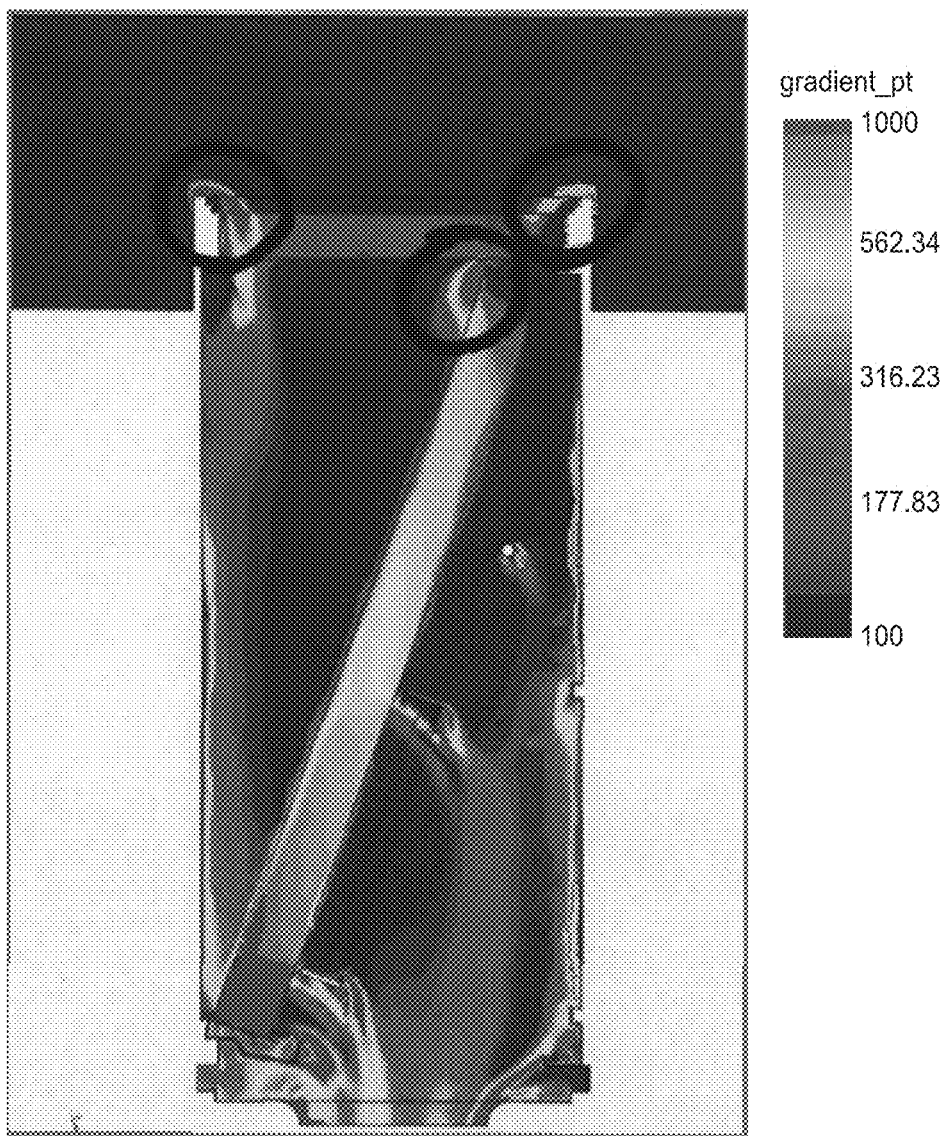
FIG. 1 is a thermal image of a prior art CRAC unit.

Data centers are typically large rooms designed, in certain instances, to house hundreds of electronic equipment racks arranged in rows within the data center. The rows of equipment racks can be arranged in such a manner that there are cold aisles and hot aisles. The cold aisles provide access to the fronts of the enclosures where the electronic equipment is typically accessed. The hot aisles provide access to the backs of the equipment racks. As requirements change, the number of equipment racks may be increased or decreased depending on the functional requirements of the data center. A CRAC unit of an embodiment of the present disclosure includes an airfoil frame at a suction side of the CRAC unit to increase efficiency by eliminating pressure drops.

In one embodiment, each CRAC unit has a housing that is configured to support components of the cooling system within the housing. For example, in one embodiment, the components of the CRAC unit may include a heat exchanger embodying an evaporator that is coupled to a source of liquid refrigerant. The evaporator is connected to the source so that liquid refrigerant is delivered to the evaporator and vaporized refrigerant is returned to the source. In this embodiment, the evaporator is used if the CRAC unit is a direct expansion (DX) system where the liquid refrigerant evaporates in the evaporator creating the cooling effect. In other embodiments, the heat exchanger of the CRAC unit uses chilled water to cool the air. Chilled water is created and provided by an external chiller. The CRAC unit may further include one or more fan modules at a bottom of the CRAC unit to move air across the heat exchanger. The fan module may be positioned anywhere within the CRAC unit to drive movement of air through the CRAC unit. The CRAC unit may be disposed within a row of equipment racks and configured to intake the hot air within the data center from a hot aisle, for example, to cool the air to slightly below ambient temperature. This configuration eliminates the inefficiency of mixing hot air with the room temperature air to obtain a warm mixture.

The cooling system of embodiments of the present disclosure is capable of employing one or more CRAC units on an as needed basis to provide localized cooling within the data center. Specifically, multiple CRAC units may be placed anywhere within the data center, including being interspersed in a row of equipment racks to more efficiently cool the data center. The circulation path of warm air generated by the electronic equipment is greatly reduced, thereby nearly eliminating the mixing of hot and cold air within the data center.

At least one embodiment of the present disclosure is directed an airfoil frame that is used in a CRAC unit that is selectively positionable to cool electronic equipment housed within equipment enclosures or racks of a data center. As used herein, "enclosures" and "racks" are used to describe apparatus designed to support electronic equipment. Such an airfoil frame is designed to address pressure drops associated with the suction side of the CRAC unit, where air entering the CRAC unit must bend due to a sharp edge of a housing of a traditional CRAC unit, which can cause a large pressure drop. The airfoil creates a boundary layer that substantially eliminates pressure drops at the inlet of the housing of the CRAC unit. Specifically, the airfoil enables the boundary layer to continue along a length of the airfoil, with the slots drawing the boundary layer toward the airfoil, thereby reducing pressure drops within the CRAC unit.

Figure 2:
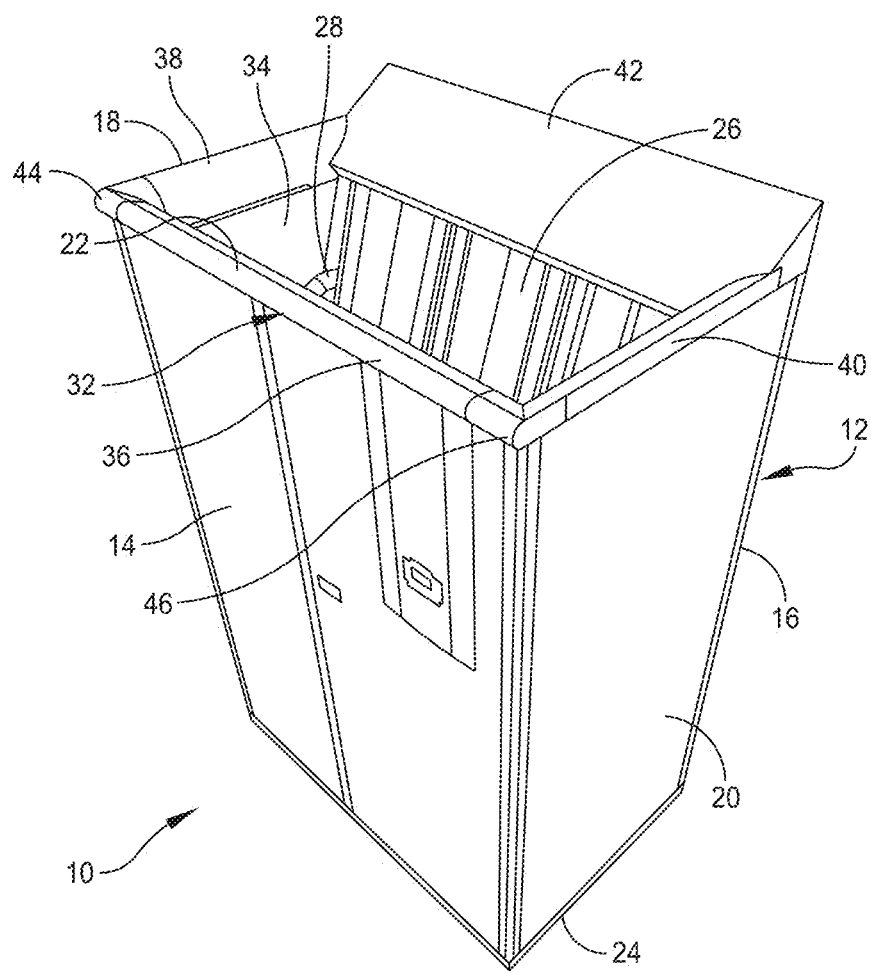
FIG. 2 is a perspective view of a CRAC unit having an airfoil frame of an embodiment of the present disclosure.

Referring to the drawings, and more particularly to FIG. 2, in order to address the heat build-up and hot spots within the data center, and to address climate control issues within the data center in general, one or more CRAC units are provided. In one embodiment, a CRAC unit, generally indicated at 10, includes a housing generally indicated at 12 that may be constructed similarly to a housing of an equipment rack. Like an equipment rack, the housing 12 of the CRAC unit 10 is a rectangular structure having a front 14, a back 16, two sides 18, 20, a top 22 and a bottom 24 defined by a frame constructed of vertical and horizontal support members. Covers or panels are provided to cover the front, back, and sides. As will be disclosed in greater detail below, the CRAC unit 10 is configured to accommodate and house cooling equipment, and, in some embodiments, may be conveniently broken down and disassembled for transport or storage with the aid of hand tools only.

Figure 3:
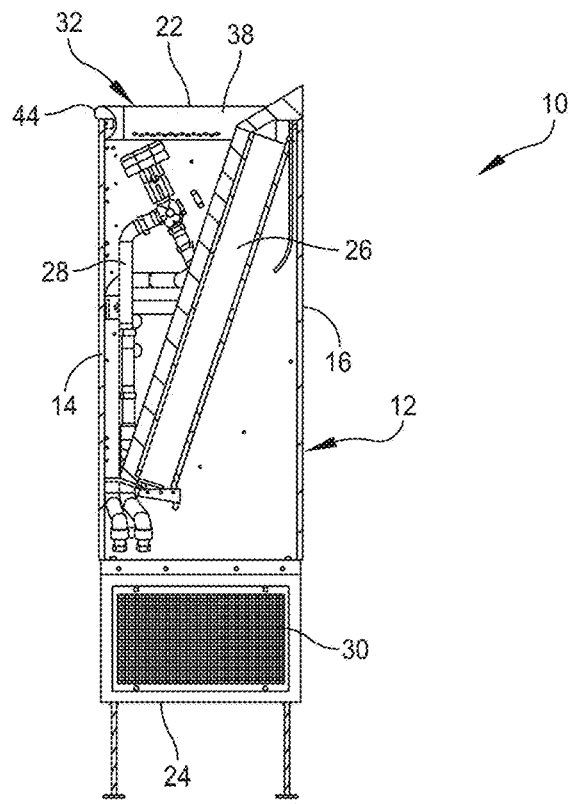
FIG. 3 is a partial cross-sectional view of the CRAC unit shown in FIG. 2.

Referring to FIG. 3, the housing 12 of the CRAC unit 10 creates a space within an interior region of the CRAC unit to allow components of a cooling system to be housed within the CRAC unit. In certain embodiments, a front panel and a back panel may be secured to the frame of the housing 12 of the CRAC unit 10 by quarter-turn latches to enable easy attachment and removal of the panels so that the interior region may be quickly accessed. The CRAC unit 10 includes a heat exchanger 26 embodying a coil that is supported by the housing 12 and coupled to a source of liquid refrigerant by suitable piping 28. The heat exchanger 26 is connected to the source so that liquid refrigerant is delivered to the heat exchanger and vaporized refrigerant is returned to the source. In another embodiment, the heat exchanger 26 can be connected to a source of chilled fluid, such as chilled water. The CRAC unit 10 further includes a fan module 30 provided at the bottom 24 of the housing 12 of the CRAC unit to move air across the heat exchanger 26 from the top 22 of the housing of the CRAC unit to the bottom of the housing of the CRAC unit. In some embodiments, the air is passed through one or more filters (not shown) disposed within the interior region of the CRAC unit 10 to purify the air. The air may be further passed through additional heat exchangers to condition the air prior to being discharged from the CRAC unit.

Figure 4:
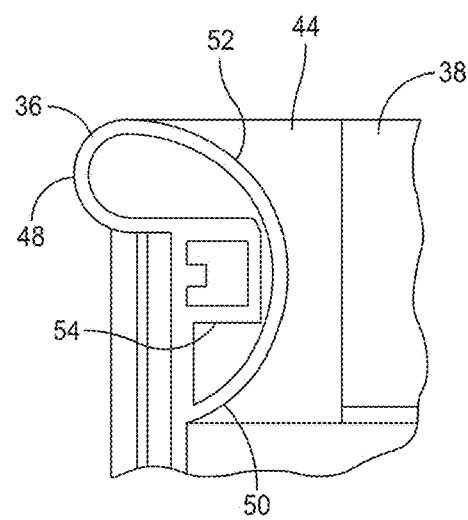
FIG. 4 is an enlarged cross-sectional view of the airfoil frame.

Referring additionally to FIG. 4, the housing of the CRAC unit 10 further includes a modular airfoil frame, generally indicated at 32, which is located on the top 22 of the housing 12 of the CRAC unit at an inlet 34 of the housing. In one embodiment, the airfoil frame 32 includes a front part 36, two side parts 38, 40, a back part 42, and two corner parts 44, 46. As shown, the front part 36 of the airfoil frame 32 embodies a front airfoil frame member secured to a front 14 of the housing 12 at the inlet 34 of the housing. The side parts 38, 40 of the airfoil frame 32 embody a first side airfoil frame member secured to one of the sides of the housing, e.g., side 18, at the inlet 34 of the housing 12, and a second side airfoil frame member secured to the opposite side of the housing, e.g., side 20, at the inlet 34 of the housing. In the shown embodiment, the airfoil frame member 32 has an annular structure that is hollow in construction.

Although the front airfoil member 36 and the side airfoil frame members 38, 40 of the airfoil frame 32 are configured to overlap the upper edges of the front 14 and the sides 18, 20 of the housing 12, the airfoil frame can be configured to include airfoil frame members that overlap any part of the inlet of the housing. For example, back part 42 of the airfoil frame 32 can include a back airfoil frame member so that the airfoil construction surrounds the entire inlet 34 of the housing 12 with the front airfoil member 36 and side airfoil frame members 38, 40. In another example, the airfoil frame 32 can include the front airfoil frame member 36 only, with the side parts 38, 40 being configured similarly as the back part 42 of the airfoil frame.

FIG. 4 illustrates a cross-sectional view of the front airfoil frame member 36. The side airfoil frame members 38, 40 are each similarly constructed. As shown, the airfoil frame member 36 includes a leading edge 48 extending from the front 14 of the housing 12 and a trailing edge 50 extending in a direction that is generally parallel to the front of the housing. In one embodiment, as mentioned above, the airfoil frame member 36 is hollow in construction and further includes an outer surface 52 extending from the leading edge 48 to the trailing edge 50. The airfoil frame member 36 can be configured to be secured to a frame member 54 of the housing 12 so that the airfoil frame member covers the frame member of the housing. The outer surface 52 may define a suction surface that is generally associated with higher velocity and lower static pressure. The leading edge 48 of the airfoil frame member 36 is the point at the front of the airfoil that has maximum curvature (minimum radius). The trailing edge 50 of the airfoil frame member 36 is the point of maximum curvature at a back of the airfoil frame member. The airfoil frame member 36 includes a chordline that extends from the leading edge 48 to the trailing edge 50.

Figure 5:
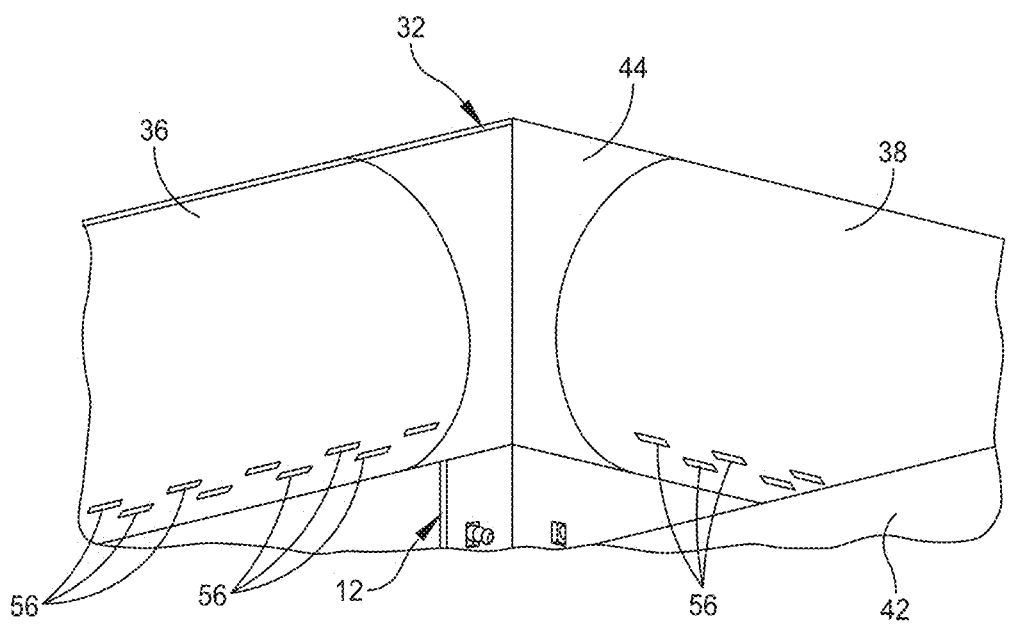
FIG. 5 is an enlarged perspective view of a portion of the airfoil frame.
Figure 6:
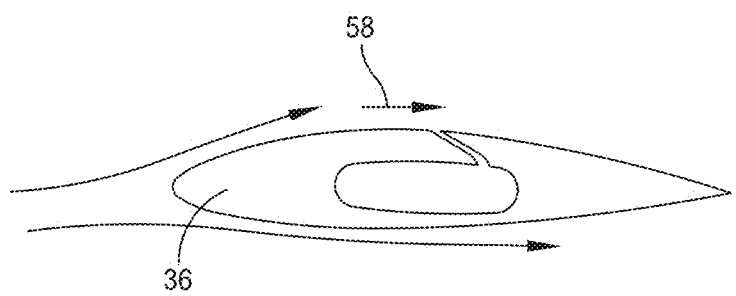
FIG. 6 is a schematic cross-sectional view of airflow over the airfoil frame.

Referring to FIG. 5, the airfoil frame members 36, 38 further include a plurality of slots, each indicated at 56, formed in the outer surface 52. In one embodiment, adjacent slots 56 are staggered with respect to one another. Specifically, one row of slots 56 are formed in the outer surface 52 of the airfoil frame member, e.g., airfoil frame member 36, is closer to the leading edge 48 and another row of slots are formed in the outer surface of the airfoil frame member is closer to the trailing edge 50. In another embodiment, the slots can be oriented in any desired configuration, e.g., in a straight line. The outer surface 52 and the slots 56 of the airfoil frame member 36 create a boundary layer over the surface of the airfoil frame member. FIG. 6 illustrates the boundary layer 58 created by the outer surface 52 of the airfoil frame member 36 having the slots 56.

The internal space defined by the airfoil frame 32 is connected to a depressurized space which is the space having the heat exchanger 26. This connection can be realized by means of one or more connection pipes 28 (FIG. 3). In fact, this depressurized space has a pressure lower than the pressure of the IT air entering the CRAC unit 10 due the pressure drop generated by air passing through the heat exchanger 26. Typically, this pressure drop is about 50-100 Pa depending on the air speed, the number or the row of the heat exchanger, the fin pitch, etc.

Figure 7:
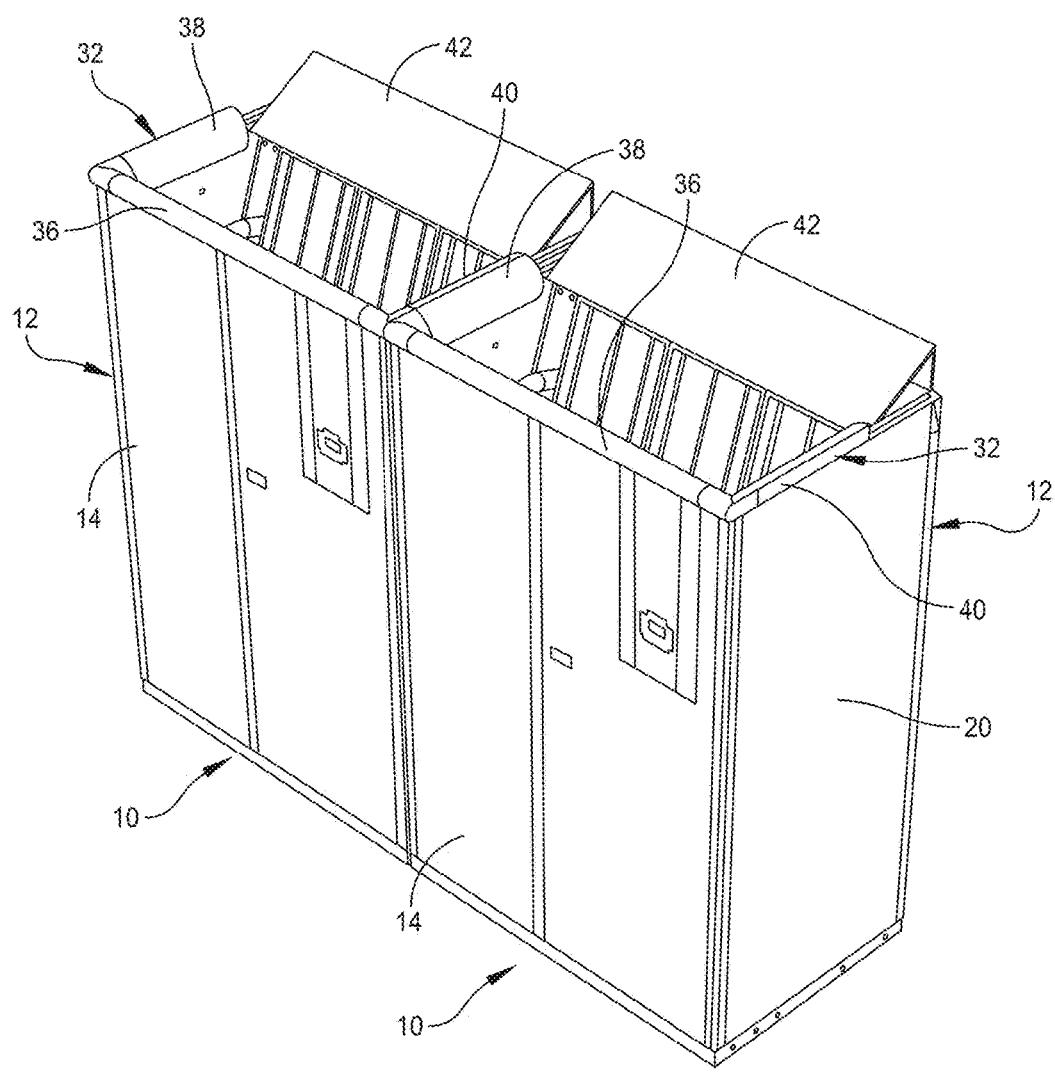
FIG. 7 is a perspective view of two CRAC units placed in a side-by-side relationship.
Figure 8:
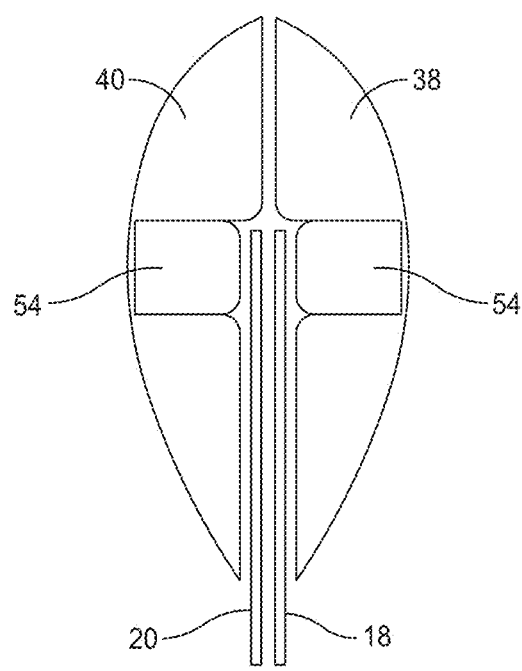
FIG. 8 is a cross sectional view of airfoil frames of the CRAC units shown in FIG. 7.

Referring to FIGS. 7 and 8, there is illustrated at least two CRAC units 10 arranged in side-by-side configuration. FIG. 8 illustrates the two side airfoil frame members 38, 40 of adjacent frame members 32 located side-by-side to form a fully aerodynamic shape.

Another method to avoid the separation of the boundary layer 58 is to provide energy to the layer itself. This can be done blowing high pressure air in the boundary layer 58.

In CRAC units, high pressure air is available in the discharge side of the fan module. So, if the airfoil frame profile is provided to the discharge side of the fan module, and treated air can be injected in the boundary layer.

In certain embodiments, the CRAC unit may be one-half the width of a standard size nineteen inch equipment rack, e.g., twelve inches in width, and may be modular so that the CRAC unit may be inserted into a row of equipment racks. The modular nature of the cooling system allows the user to optimize the location of each CRAC unit. Thus, the cooling system may be employed and redeployed for maximum efficiency and use within the data center.

The phraseology and terminology used herein is for the purpose of description and should not be regarded as limiting. Any references to embodiments or elements or acts of the systems and methods herein referred to in the singular may also embrace embodiments including a plurality of these elements, and any references in plural to any embodiment or element or act herein may also embrace embodiments including only a single element. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, and vertical and horizontal are intended for convenience of description, not to limit the present systems and methods or their components to any one positional or spatial orientation.

Having thus described several aspects of at least one embodiment, it is to be appreciated various alterations, modifications, and improvements will readily occur to those skilled in the art. Such alterations, modifications, and improvements are intended to be part of this disclosure and are intended to be within the scope of the disclosure. Accordingly, the foregoing description and drawings are by way of example only, and the scope of the disclosure should be determined from proper construction of the appended claims, and their equivalents.

What is claimed is:

1. A method of reducing pressure drops within a computer room air conditioner unit comprising a housing including a front, a back, two sides, a bottom and an open top, the open top of the housing being configured to receive and direct air toward an interior region of the housing, a heat exchanger supported by the housing within the interior region of the housing, at least one fan module supported by the housing, the at least one fan module being configured to draw air into the housing through the inlet, direct air through the heat exchanger, and exhaust treated air through the outlet, and an airfoil frame secured to the upper portions of the front and the sides of the housing at the open top of the housing, the arrangement being such that the heat exchanger is disposed below the airfoil frame, the airfoil frame defining an inlet of the housing and being configured to direct air to the heat exchanger and to create a boundary layer that substantially eliminates pressure drops at the inlet of the housing, the method comprising:

directing air over the airfoil frame of the housing of the computer room air conditioner unit.

2. The method of claim 1, wherein the airfoil frame includes at least one airfoil frame member secured to the housing at the inlet of the housing, the at least one airfoil frame member including a leading edge extending from the front of the housing and a trailing edge extending in a direction that is parallel to the front of the housing.

3. The method of claim 2, wherein the at least one airfoil frame member is hollow in construction and further includes an outer surface extending from the leading edge to the trailing edge.

4. The method of claim 3, wherein the at least one airfoil frame member further includes a plurality of slots formed in the outer surface.

\* \* \* \* \*